United States Patent
He et al.

(10) Patent No.: US 8,171,435 B2
(45) Date of Patent: May 1, 2012

(54) INTEGRATED CIRCUIT STRUCTURE INCORPORATING AN INDUCTOR, AN ASSOCIATED DESIGN METHOD AND AN ASSOCIATED DESIGN SYSTEM

(75) Inventors: Zhong-Xiang He, Essex Junction, VT (US); Robert M. Rassel, Colchester, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 184 days.

(21) Appl. No.: 12/720,728

(22) Filed: Mar. 10, 2010

(65) Prior Publication Data
US 2010/0175035 A1    Jul. 8, 2010

Related U.S. Application Data

(63) Continuation of application No. 11/692,948, filed on Mar. 29, 2007, now Pat. No. 7,750,408.

(51) Int. Cl.
*G06F 17/50* (2006.01)
*G06F 11/22* (2006.01)

(52) U.S. Cl. .................. 716/100; 716/101; 716/136

(58) Field of Classification Search .......... 716/100–101, 716/115, 118–119, 122, 132–133, 136
See application file for complete search history.

(56) References Cited

U.S. PATENT DOCUMENTS

| | | | |
|---|---|---|---|
| 6,395,637 B1 | 5/2002 | Park et al. | |
| 6,486,017 B1 | 11/2002 | Verma et al. | |
| 6,704,179 B2 | 3/2004 | Voldman | |
| 6,833,603 B1 | 12/2004 | Park et al. | |
| 6,845,491 B2 * | 1/2005 | Miller et al. | 438/17 |
| 7,078,998 B2 | 7/2006 | Zhang et al. | |
| 7,105,420 B1 | 9/2006 | Chan et al. | |
| 7,257,796 B2 * | 8/2007 | Miller et al. | 716/113 |
| 2002/0093414 A1 | 7/2002 | Wong et al. | |
| 2004/0080881 A1 | 4/2004 | Chou | |
| 2005/0003562 A1 | 1/2005 | Bhatt et al. | |
| 2005/0102644 A1 | 5/2005 | Collins et al. | |
| 2005/0156281 A1 | 7/2005 | Eshun et al. | |
| 2005/0184344 A1 | 8/2005 | Ker et al. | |
| 2005/0221572 A1 | 10/2005 | Eshun et al. | |

(Continued)

OTHER PUBLICATIONS

He et al., U.S. Appl. No. 11/692,948, Restriction Requirement, May 20, 2009, 5 pages.

(Continued)

*Primary Examiner* — Stacy Whitmore
(74) *Attorney, Agent, or Firm* — Gibb I.P. Law Firm, LLC; Anthony J. Canale

(57) ABSTRACT

Disclosed are embodiments of a circuit (e.g., an electrostatic discharge (ESD) circuit), a design methodology and a design system. In the circuit, an ESD device is wired to a first metal level (e.g., M1). An inductor is formed in a second metal level (e.g., M5) above the first metal level and is aligned over and electrically connected in parallel to the ESD device by a single vertical via stack. The inductor is configured to nullify, for a given application frequency, the capacitance value of the ESD device. The quality factor of the inductor is optimized by providing, on a third metal level (e.g., M3) between the second metal level and the first metal level, a shield to minimize inductive coupling. An opening in the shield allows the via stack to pass through, trading off Q factor reduction for size-scaling and ESD robustness improvements.

20 Claims, 9 Drawing Sheets

U.S. PATENT DOCUMENTS

| | | |
|---|---|---|
| 2006/0022787 A1 | 2/2006 | Brennan et al. |
| 2006/0097836 A1 | 5/2006 | Sakamoto |
| 2006/0151851 A1 | 7/2006 | Pillai et al. |
| 2006/0157798 A1 | 7/2006 | Hayashi et al. |
| 2006/0284718 A1 | 12/2006 | Baumgartner et al. |

OTHER PUBLICATIONS

He et al., U.S. Appl. No. 11/692,948, Restriction Requirement, Jun. 22, 2009, 4 pages.

International Business Machines Corporation PCT International Search Report and Written Opinion, PCT/US2008/05148, Jul. 15, 2008.

Dunn et al., "Foundation of RF CMOS and SIGE BICMOS Technologies", IBM J. research and Developments, vol. 47, No. 2/3, Mar./May 2003.

Chun, "ESD-Protection Circuits for Advanced SMOS Technologies", A Dissertation Submitted to the Department of Electrical Engineering and the Committee on Graduate Studies of Stanford University in Partial Fulfillment of the Requirements for the Degree of Doctor of Philosophy, Jun. 2006.

Bohm et al., "ESD-Protected RF Filter with On-Chip Passive and Active Elements", www.rfdesign.com, Nov. 2006, pp. 22-26.

He et al., U.S. Appl. No. 11/692,948, Office Action Communication, Aug. 20, 2009, 10 pages.

He et al., U.S. Appl. No. 11/692,948, Notice of Allowance, Feb. 22, 2010, 3 pages.

\* cited by examiner

INTEGRATED CIRCUIT STRUCTURE INCORPORATING AN INDUCTOR, AN ASSOCIATED DESIGN METHOD AND AN ASSOCIATED DESIGN SYSTEM

CROSS-REFERENCE TO RELATED APPLICATIONS

This application is a Continuation of U.S. application Ser. No. 11/692,948 filed Mar. 29, 2007, which has issued as U.S. Pat. No. 7,750,408, the complete disclosure of which, in its entirety, is herein incorporated by reference.

BACKGROUND

1. Field of the Invention

The embodiments of the invention generally relate to inductors and, more particularly, to an integrated circuit structure incorporating a back end of the line (BEOL) inductor.

2. Description of the Related Art

Circuit designers for radio frequency (RF) applications want a constant impedance ($Z_{RF}$) (e.g., $Z_{RF}$=50 Ohms). Impedance ($Z_c$) of a capacitor is defined as one over the frequency ($\omega$) capacitance (C) (i.e., $Z_c$=1/$\omega$C). Thus, if a silicon device with load capacitance is added to an RF application, then the added capacitance will necessarily decrease impedance.

Electrostatic discharge (ESD) devices are often connected to Input/Output (I/O) pads of integrated circuits in order to safely discharge electrostatic discharge current (e.g., from human body model (HBM) events, charged device model (CDM) events, machine model (MM) events, etc.). However, ESD devices are typically formed using active elements, such as diodes, transistors, rectifiers, etc., which inherently provide capacitance (C). Thus, incorporation of ESD devices into RF applications will, as discussed above, decrease the circuit impedance $Z_{RF}$.

SUMMARY

Disclosed herein are embodiments of an improved integrated circuit structure (e.g., an electrostatic discharge (ESD) circuit structure) that incorporates an inductor, a design methodology for such an ESD circuit structure and an associated design system.

Embodiments of the integrated circuit structure can comprise a substrate, a first metal level (e.g., M1, M2, etc.) above the substrate, and at least one additional metal level above the first metal level (e.g., M2-Mx).

This integrated circuit structure can further comprise an inductor in one of the additional metal levels (e.g., M5) above the first metal level, thereby forming a back end of the line (BEOL) inductor. The inductor can be aligned over and be substantially parallel to the substrate. The inductor can comprise a planar conductive coil (e.g., a circular coil, a rectangular coil, an octagonal coil, etc.), having an inner end and an outer end. Additionally, a conductor (e.g., a via stack) can extend vertically from one end (i.e., a first end, e.g., an inner end) of the coil down to the first metal level or through the first metal level to a silicon region in the substrate.

The integrated circuit structure can further comprise a patterned conductive shield for minimizing any inductive coupling between the substrate and the inductor. This shield can be located in an additional metal level between the first metal level and the inductor (e.g., in M2, M3, Mx, etc.). To accommodate the conductor, the shield comprises an opening, which allows the conductor to extend vertically down to a lower metal level (e.g., the first metal level) or to the substrate from the end of the coil.

The inductor alone can function as an electrostatic discharge (ESD) device for a functional circuit (e.g., for an additional integrated circuit in a radio frequency (RF) application that is connected in parallel to the inductor and wired to the first metal level (e.g., to M1)). The inductor can also serve as a "shunt" to ground, or $V_{DD}$ power supply. Specifically, the integrated circuit structure can further comprise an input/output pad and an additional circuit. A second end (e.g., an outer end) of the coil can be electrically connected to a positive supply voltage (Vdd) or ground ($V_{SS}$) and the first end (e.g., the inner end) of the coil can be electrically connected to the input/pad and to the additional circuit (e.g., via the first metal level). If the first end (e.g., the inner end) of the coil is further shorted to ground and the coil comprises a metal wire having a predetermined minimum width that is capable of sustaining a specified current density (e.g., an electrostatic discharge (ESD) current density) without failure, then the inductor can function as an ESD device. Alternatively, if the second end (e.g., the outer end) of the coil is further connected to $V_{DD}$ and the coil comprises a metal wire having a predetermined minimum width that is capable of sustaining a specified current density (e.g., an electrostatic discharge (ESD) current density) without failure, then the inductor can function as an ESD device.

Alternatively, the inductor can work in combination with another ESD device in an ESD circuit in order to provide ESD protection to the functional circuit. Specifically, in one exemplary embodiment, the integrated circuit structure can comprise an electrostatic discharge (ESD) circuit. This ESD circuit can comprise a semiconductor device connected in parallel with the BEOL inductor, and more specifically, an electrostatic discharge (ESD) device connected in parallel with the BEOL inductor, for providing ESD protection to the functional circuit. Thus, the ESD circuit comprises a series inductor-capacitor (LC) circuit because the ESD device in the substrate necessarily has capacitance.

The inductor in this "LC" circuit can be configured to nullify, for a given application frequency ($\omega$), the capacitance value (C) of that ESD device. The embodiment further allows the size of the ESD circuit to be minimized and ESD robustness to be optimized by aligning the inductor above the ESD device and using a single vertical conductor (e.g., a via stack) to form the electrical connection between an end of the inductor coil (e.g., the inner end) and the ESD device. By placement of the inductor above the ESD device, area is saved (i.e., minimized) for the ESD protection circuit. By connecting the inductor and ESD device with a vertical conductor alone and avoiding the use of a horizontal underpass, ESD robustness can be improved. Additionally, the quality factor Q of the inductor is optimized by providing, between the inductor and ESD device, a shield to minimize inductive coupling. An opening in the shield allows the via stack to pass through, trading off a reduction in the quality factor Q of the inductor with the gains in circuit size scaling and ESD robustness.

More particularly, in this embodiment the integrated circuit structure can comprise an additional circuit (e.g., a functional integrated circuit for an RF application) electrically connected to an ESD circuit. That is, the integrated circuit can comprise a substrate, silicon regions of the ESD device and additional circuit in the substrate, and multiple metal levels and inter-level dielectrics films above the substrate. The metal levels can comprise a first metal level (e.g., M1) above the substrate, and at least one additional metal level (e.g., M2, M3, M4, M5, Mx etc.) above the first metal level.

The ESD device can comprise a single component or a multi-component device and can be electrically connected to a given metal level (i.e., a first metal level, such as M1) above the substrate. The type and size of the ESD device can be predetermined so that the ESD device is capable of providing a desired level of electrostatic discharge (ESD) protection to an additional circuit (e.g., a integrated circuit designed for a radio frequency (RF) application). The ESD device can, for example, be wired to the first metal level (e.g., M1). Based on the size and type of the ESD device, it will necessarily have a specific capacitance value.

This integrated circuit structure can further comprise an inductor in one of the additional metal levels (e.g., M5) above the first metal level such that it is aligned over and substantially parallel to the ESD device. The inductor can comprise a planar conductive coil (e.g., a circular coil, a rectangular coil, an octagonal coil, etc.) having an inner end and an outer end. Additionally, a conductor (e.g., a via stack) can extend vertically from one end (i.e., a first end, e.g., the inner end) of the coil down to the metal level of the ESD device (e.g., M1) or down to the substrate surface such that the inductor is electrically connected to the ESD device metallization or directly to the ESD device, respectively. Thus, the integrated circuit comprises an ESD circuit comprising a parallel inductor-capacitor (LC) circuit. Connecting the inductor and ESD device with a vertical conductor alone and avoiding the use of a horizontal underpass can improved ESD robustness and can allow for ESD circuit size-scaling.

The coil can comprise a metal wire with a predetermined minimum width capable of sustaining a specified current density (e.g., a specified electrostatic discharge (ESD) current density) without failure. Furthermore, the inductor in this LC circuit can be configured to have a predetermined inductance value (L). This predetermined inductance value (L) can be based on the capacitance value (C) of the ESD device and on a specified application frequency ($\omega$) (e.g., the specified application frequency ($\omega$) of the RF application). If the application frequency ($\omega$) is equal to the resonance frequency of the LC circuit, the impedance value of the inductor-capacitor circuit ($Z_{LC}$) tends toward infinity. An LC circuit impedance value ($Z_{LC}$) at resonance frequency ensures that the LC circuit is insignificant when placed in parallel with the functional RF circuit (i.e., when placed in parallel with the additional circuit being protected by the ESD circuit so that the impedance value of the additional circuit ($Z_{RF}$) is not decreased as a result of the ESD device). This condition is optimal for functional circuits in RF applications which require constant impedance. To accomplish this, the inductor should have an inductance value (L) that is approximately equal to one over the product of the capacitance value (C) of the semiconductor device and the specified application frequency squared ($\omega^2$) (i.e., $L=1/\omega^2 C$). Then, inductor is configured to achieve that predetermine inductance value (L). That is, the shape of the coil, the number of turns in the coil, the length of the coil and the diameter of the coil are all predetermined to achieve the predetermined inductance value (L) and to satisfy ESD robustness.

This embodiment can further comprise a shield in one of the additional metal levels between the ESD inductor and the first metal level (e.g., in M2, M3 or M4) and, thus, between the inductor and the ESD device. This shield can be configured to minimize inductive coupling between inductor and ESD device and to ensure that the quality factor Q of the inductor is maximized. Additionally, this shield comprises an opening to accommodate the conductor (e.g., the via stack) that extends between the inductor and the first metal layer or between the inductor and the substrate such that the ESD device and inductor are electrically connected. Although the opening in the shield may reduce the quality factor Q of the inductor, this reduction in quality factor is traded off against the size scaling and ESD robustness improvements.

In order to complete the ESD circuit and provide ESD protection to the functional circuit, as described above, the integrated circuit structure of this embodiment can also comprise an input/output pad. The first end (e.g., the inner end) of the inductor coil, the ESD device and the functional circuit are electrically connected to each other as well as to the input/pad. Additionally, the second end (e.g., the outer end) of the coil can be electrically connected to ground and the ESD device can further be electrically connected to a positive supply voltage. Alternatively, the second end (e.g., the outer end) of the coil can be electrically connected to a positive supply voltage and the ESD device can be electrically connected to ground. In this fashion, they are in a parallel configuration during a.c. analysis.

Also disclosed are embodiments of a method for designing the electrostatic discharge circuit, as described above, as well as a program storage device readable by computer and tangibly embodying a program of instructions executable by the computer to perform this method.

Specifically, the method embodiments comprise receiving user input, including design parameters for an electrostatic discharge circuit for protecting an additional circuit of, for example, a radio frequency (RF) application. The design parameters for the ESD circuit can specify that the ESD circuit will comprise an ESD device electrically connected in parallel to an inductor so as to form a LC circuit because the ESD device necessarily provides capacitance. More specifically, the design parameters can include, but are not limited to, a specific type of ESD device to be used, the desired ESD device protection level and the survival objectives for the inductor (i.e., the current density (e.g., the ESD current density) which the inductor should be able to sustain without failure). Also received is a specified application frequency (i.e., the application frequency for the circuit being protecting by the ESD circuit).

Based on these design parameters, an initial design for the ESD device alone is generated (i.e., a first design). This includes inter-level dielectric films, and wiring of the ESD device (e.g., to a first metal level, such as M1) above the ESD device silicon regions.

Based on this first design, a capacitance value for the ESD device can be determined. Specifically, a table of capacitance values according to device sizes and types can be accessed and the capacitance value of the ESD device can thus be determined based on its type and size as specified by the first design.

Once the capacitance value of the ESD device is determined, a desired inductance value for the inductor can be determined so that the LC circuit (i.e., the ESD circuit) has a resonant frequency at the application frequency. When the application frequency is at the LC tank resonant frequency, the LC ESD circuit will have an impedance value that approaches infinity. Specifically, an LC circuit impedance value ($Z_{LC}$) at resonant frequency ensures that the LC circuit parallel impedance is large compared to the functional circuit being protected by the ESD circuit so that the impedance value of the additional circuit ($Z_{RF}$) is not decreased as a result of the ESD device. This condition is optimal for circuits in RF applications which require constant impedance. Note that in this methodology, it is clear that the circuit designer can choose a LC value such that the desired net impedance is achieved for the given circuit application (e.g., the ESD device and L combination can be near the application frequency and have additional impedance contributions). To determine the inductance value (L) the design system solves for one over the product of the capacitance value (C) of the ESD device and the specified application frequency squared ($\omega^2$) (i.e., L=1/$\omega^2$C).

Once the inductance value (L) is determined, then another design (i.e., a second design) can be generated which comprises an inductor with the inductance value previously determined and which also incorporates the initial design for the ESD device. Specifically, the design for the inductor-ESD device combination (i.e., the second design) is generated such that it comprises a planar conductive coil formed in a second metal level (e.g., the M5 level) that is above the first metal level (e.g., above M1) and, more specifically, that is above the ESD device. Achieving the desired inductance value is accomplished by selecting the diameter of the planar conductive coil, the shape of the coil, the number of turns in the coil and the length of the coil. This second design should orient (i.e., align) the inductor over the ESD device and should electrically connect the inductor to either the first metal level (e.g., M1) to which the ESD device is wired or to the substrate, such that the inductor and ESD device are electrically connected This is accomplished by providing a conductor (e.g., a via stack) that extends vertically from one end (i.e., a first end, e.g., the inner end) of the inductor coil to the first metal level (i.e., the ESD metallization, e.g., M1) or directly to the ESD device at the substrate surface such that the ESD device and inductor are electrically connected.

Additionally, as mentioned above, the design parameters received as input from a user can comprise a specified current density (e.g., an ESD current density), which the inductor should be able to sustain without failure. Based on this current density, the method can further comprise determining the minimum wire width required for the inductor to be able to sustain this current density and, then generating the second design so that the inductor coil has no less than this minimum wire width.

By designing the ESD circuit with both an ESD device and an inductor connected in parallel, the net impedance of the RF circuit (i.e., the functional circuit being protected by the inductor-ESD circuit) remains uniform (i.e., constant), which is optimal for RF applications. By designing the ESD circuit with a vertical via stack and avoiding the use of a horizontal underpass, ESD robustness can be improved. By designing the ESD circuit such that the inductor is positioned directly over the ESD device and such that a via stack connects one end of the inductor coil (i.e., the first end, e.g., the inner end) to the first metal level, the area (e.g., the total size) of the ESD circuit can be minimized. That is, placing a silicon device (e.g. ESD silicon device) under the inductor does not waste the silicon area and placing the inductor over the ESD device does not waste area for the inductor area. Additionally, using an inductor in the ESD circuit instead of a second silicon element saves area on the chip surface. However, because the ESD device is positioned below the inductor, inductive coupling will occur and the quality factor Q of the inductor will be reduced. This can be compensated through RF design or introduction of other elements, such as metal shields.

Therefore, the method embodiments further comprise generating a third design comprising a shield in a third metal level (e.g., M3) between a first metal level and a second metal level. This shield is placed between the inductive coil, and the metal levels of the ESD element. The design for this shield can be configured to minimize inductive coupling between the inductor and the electrostatic discharge device of the second design. This shield can further be designed to include an opening to accommodate the conductor (e.g., the via stack) that extends between the inductor and first metal level (e.g., M1) or the substrate surface such that the ESD device and inductor are electrically connected. While this opening may reduce the quality factor Q of the inductor to a degree, this reduction in quality factor is traded off against the ESD circuit size-scaling gains as well as ESD circuit robustness.

The method embodiments, as described above, can be computer-implemented and can, for example, be accomplished by accessing a design kit comprising hierarchical parameterized cells (p-cells) for electronic components of electrostatic discharge devices, inductors and shields, each of which can be constructed in a computer-aided design (CAD) environment. Then, each of the designs (i.e., the first design for the ESD device alone, the second design that incorporates an inductor into the first design and the third design that incorporates a shield into the second design) can be generated by a processor using these hierarchical parameterized cells.

Finally, also disclosed are embodiments of an associated design system. Specifically, the design system embodiments comprise a user interface, at least one processor, a design kit and a storage device.

The user interface can be adapted to receive design parameters for an electrostatic discharge (ESD) circuit for protecting an additional circuit (e.g., a circuit of a radio frequency (RF) application). The design parameters for the ESD circuit can specify that the ESD circuit will comprise an ESD device electrically connected in parallel to an inductor so as to form an LC circuit because the ESD device necessarily has capacitance. More specifically, the design parameters can include, but are not limited to, a specific type of ESD device to be used, the desired ESD device protection level and the survival objectives for the inductor (i.e., the current density (e.g., the ESD current density) which the inductor should be able to sustain without failure). Also received is a specified application frequency (i.e., the application frequency for the circuit being protecting by the ESD circuit).

The processor can be adapted to generate an initial design (i.e., a first design) for the ESD device alone based on the design parameters (e.g., based on the specific type of ESD device to be used and the desired ESD device protection level). The first design that is generated by the processor can indicate the type and size of the ESD device and the wiring for the ESD device. For example, the design can indicate that the ESD device is wired to a first metal level (e.g., to the M1 level).

The processor can further be adapted to determine, based on this first design, a capacitance value for the ESD device. Specifically, the design system can further comprise a storage device comprising a table of capacitance values according to device sizes and types.

The processor can be adapted to access the table in order to determine the capacitance value of the ESD device based on its particular size and type as specified in the initial design.

The processor can further be adapted to determine, based on this capacitance value and on the application frequency specified by the user, a desired inductance value for the inductor so that the LC circuit (i.e., the ESD circuit) will have an impedance value that approaches infinity. Specifically, a parallel LC circuit impedance value ($Z_{LC}$) wherein the application frequency is equal to the resonance frequency ensures that the LC circuit is not seen by the additional circuit being protected by the ESD circuit so that the impedance value of the additional circuit ($Z_{RF}$) is not decreased as a result of the ESD device. This condition is optimal for circuits in RF applications which require constant impedance (e.g. 50 Ohms). To determine the inductance value (L) the method solves for one over the product of the capacitance value (C) of the ESD device and the specified application frequency squared ($\omega^2$) (i.e., $L=1/\omega^2 C$).

The processor can further be adapted to generate another design (i.e., a second design) which comprises an inductor with the inductance value previously determined and which also incorporates the initial design for the ESD device. Specifically, the processor can generate the design for the ESD inductor-ESD device combination (i.e., the second design) by designing a planar conductive coil that will be formed in a second metal level (e.g., M5) that is above the first metal level (e.g., M1). The processor can generate this design by selecting the diameter of a planar conductive coil, the shape of the coil, the number of turns in the coil and the length of the coil so that the resulting inductor will achieve the desired inductance value. The processor can further be adapted to generate this second design such that the inductor is oriented (i.e., aligned) over the ESD device and electrically connected to either the ESD metallization (i.e., a first metal level) or to the ESD device at the substrate surface by a conductor (e.g., a via stack) that extends vertically from one end (i.e., a first end, e.g., an inner end) of the inductor coil downward such that the ESD device and inductor are electrically connected.

Additionally, as mentioned above, the design parameters received as input from a user can comprise a specified current density (e.g., an ESD current density), which the inductor should be able to sustain without failure. The processor can be adapted to determine the minimum wire width required for the inductor to be able to sustain this current density and can further generate the second design so that the inductor coil has no less than this minimum wire width (i.e., to assign the inductor to a particular metal level in the layout in order to ensure that the minimum wire width can be achieved). In this process, the width of the planar conductive coil is wide enough to guarantee ESD robustness by evaluation of the current density and self-heating effects in the coil inductor itself.

In order to minimize inductive coupling between the inductor and the ESD device of the second design and, thereby, to optimize the quality factor (Q) of the inductor, the processor can also be adapted to generate a third design that comprises a shield and that incorporates the second design. Specifically, the processor can be adapted to generate the design for the inductor-shield-ESD device combination (i.e., the third design) so that a shield is positioned between the inductor and ESD device and so that this shield is configured to minimize inductive coupling. This shield, as designed, can include an opening to accommodate the conductor (e.g., the via stack) that extends downward from the inductor.

The design system can further comprise a design kit. This design kit can comprise hierarchical parameterized cells (p-cells or Pcells) for electronic components of electrostatic discharge devices, inductors and shields, each of which can be constructed in a computer-aided design (CAD) environment. The processor can be adapted to access the kit and to use these hierarchical parameterized cells in generating each of the above-described designs (i.e., the first for the ESD device along, the second design that incorporates an inductor into the first design and the third design that incorporates a shield into the second design).

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
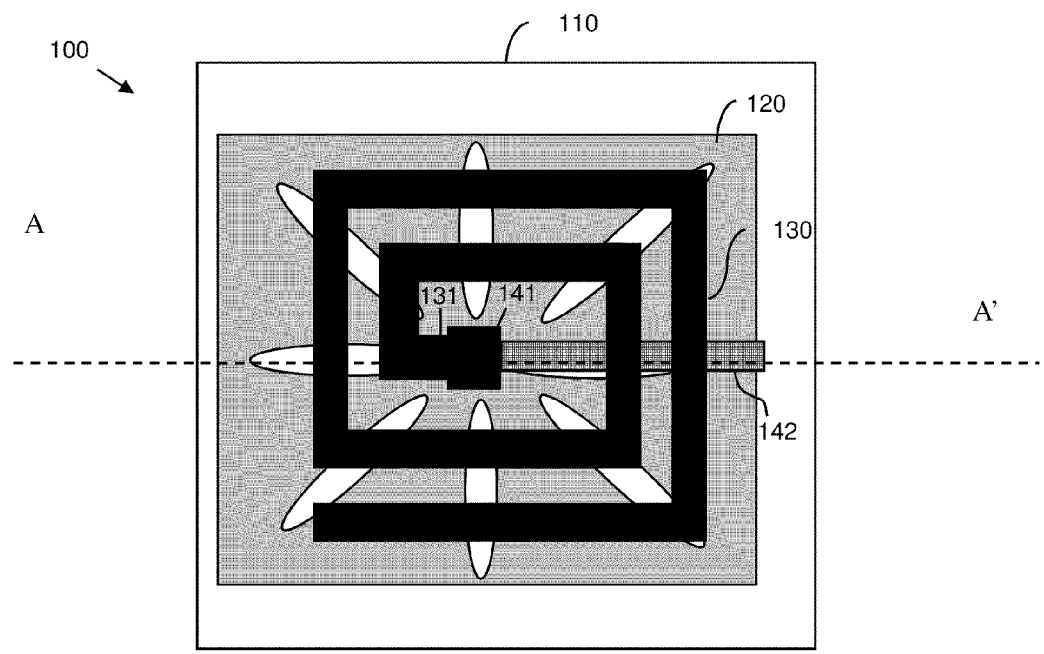
FIG. 1 is a drawing illustrating a top view of an integrated circuit.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, Electrostatic discharge (ESD) devices are often connected to Input/Output (I/O) pads of integrated circuits in order to safely discharge electrostatic discharge current (e.g., from human body model (HBM) events, charged device model (CDM) events, machine model (MM) events, etc.). However, ESD devices are typically formed using active elements, such as diodes, transistors, rectifiers, etc., which inherently provide capacitance. Thus, incorporation of ESD devices into RF applications will, as discussed above, hinder RF circuit performance by increasing impedance.

To solve this problem, an inductor can be incorporated into the ESD circuit. Specifically, an inductor incorporated into an ESD circuit will nullify the increase in capacitance and, thereby, keep impedance constant. However, incorporation of an inductor into an integrated circuit presents additional problems. First, due to the large area required for inductors, size scaling of RF applications is limited. Second, for an inductor to have a high quality factor (Q), inductive coupling between the inductor and active elements in the substrate must be minimized. Inductive coupling can be minimized, for example, by forming the inductor such that it is not over any active elements in the substrate. Alternatively, inductive coupling can be minimized by forming air columns beneath the inductor (as illustrated in U.S. Pat. No. 7,105,420 of Chan et al., issued on Sep. 12, 2006 and incorporated herein by reference), or by forming a shield between the inductor and substrate (as illustrated in U.S. Pat. No. 6,833,603 of Park et al., issued on Dec. 21, 2004).

Figure 2:
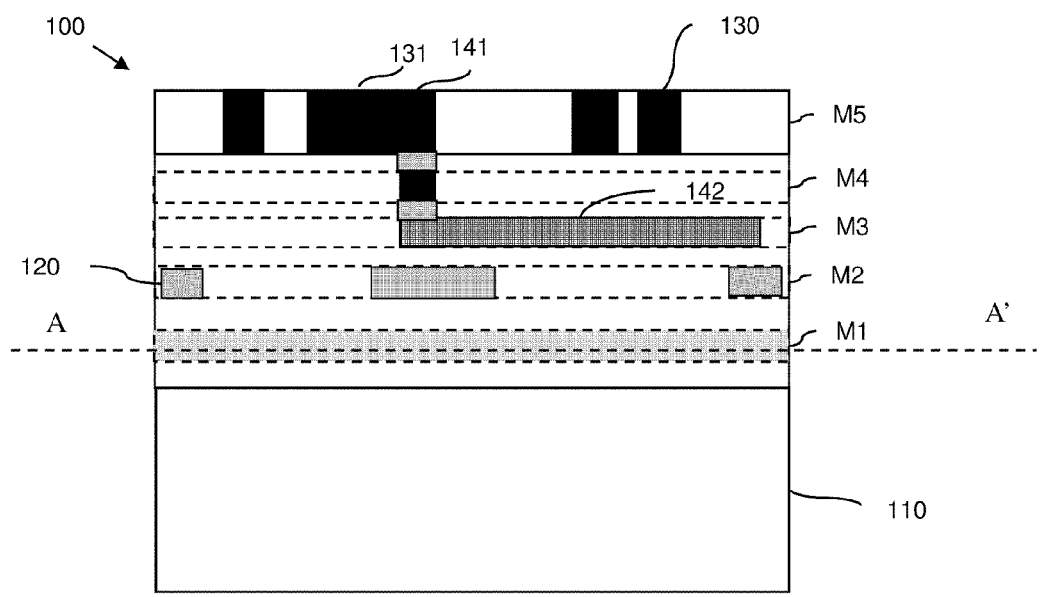
FIG. 2 is a drawing illustrating a cross-section view of the integrated circuit of FIG. 1.

For example, FIGS. 1 and 2 illustrate a top view and a cross-section view of an exemplary structure 100 incorporating a BEOL inductor 130 and a shield 120. The integrated circuit structure 100 comprises a back end of the line (BEOL) inductor 130 (e.g., patterned in the M5 layer). Inductive coupling between this inductor 130 and a conductive substrate 110 (e.g., containing active devices) can reduce the quality factor Q of the inductor 130. This inductive coupling can be reduced if no devices are formed under the inductor 130. Alternatively, inductive coupling can be eliminated or at least minimized by incorporating into the structure 100 a patterned conductive shield 120 (e.g., in the M2 layer) that is larger in area than the inductor 130 and that prevents the formation of circular currents which result in inductive coupling.

Either way the electrical connection between the inner end 131 of the inductor 130 coil and any other component in the structure 100 (e.g., a device in the substrate, another metal level, etc.) is typically provided by a via stack 141 which extends down to a metal level (e.g., M3) and connects to a conductive underpass or additional wire 142 on this metal level. The underpass 142 extends laterally beyond inductor 130 so that it may be connected to any of the other metal levels. For example, if to avoid inductive coupling no devices are located in the substrate below the inductor, the underpass 142 will allow the inner end 131 of the coil to be connected to components outside the lateral boundaries of the inductor 130. Alternatively, if a shield is used to avoid inductive coupling, the underpass 142 will allow a connection that bypasses (i.e., is diverted around) the shield 120 and down to the substrate 110. However, this structure 100 presents limits with respect to size scaling as well as electrostatic discharge (ESD) robustness.

Specifically, since the electrical connection 141-142 from the inner end 131 of the inductor 130 includes the underpass 141 on a different metal level, multiple metal levels are required for inductor 130. Additionally, the underpass 142 is electrically connected to other components outside the lateral boundaries of the inductor 130 and shield 120. Thus, the area required for the integrated circuit 100 is even greater than that for an already large inductor 130. Furthermore, if the inductor 130 functions as and ESD device or, alternatively, is to be incorporated into an electrostatic discharge (ESD) circuit, the ESD robustness of the inductor 130 is limited by the wire width at its smallest point. That is, the electrostatic discharge (ESD) current density that the inductor 130 is able to sustain without failure is a function of the smallest width of the coil wire. Since typically the BEOL metal levels (Mn-M1) progressively decrease in thickness towards the substrate 110, the thickness of the metal level (e.g., M3) in which the underpass 142 of the inductor 130 is formed effectively limits the ESD robustness of the inductor 130.

In view of the foregoing, disclosed herein are embodiments of an improved integrated circuit structure (e.g., an electrostatic discharge (ESD) circuit structure) that incorporates an inductor, a design methodology for such an ESD circuit structure and an associated design system.

Figure 3:
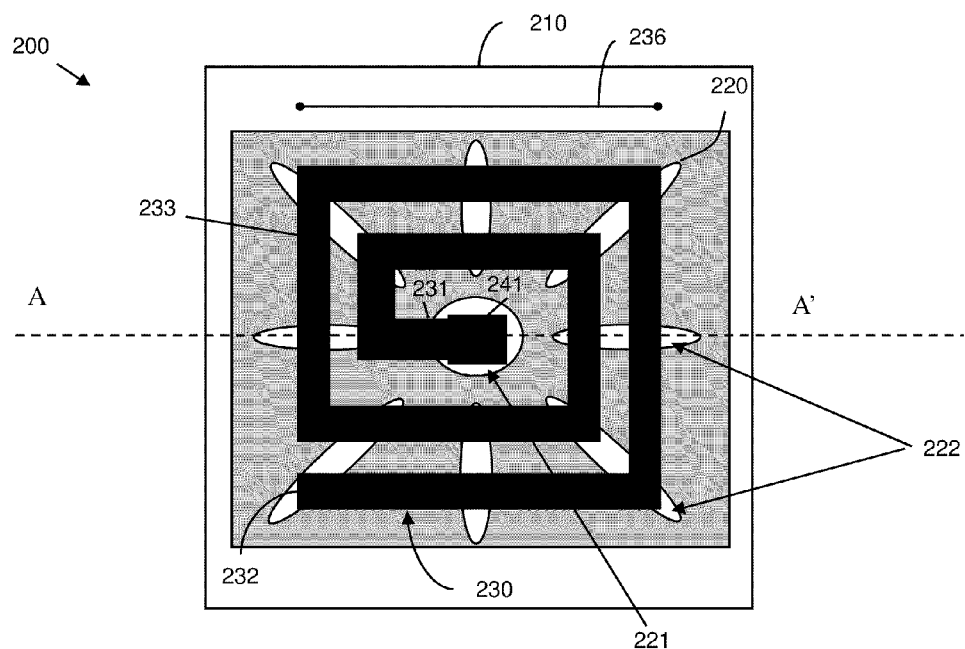
FIG. 3 is a drawing illustrating a top view of an embodiment of an integrated circuit structure.
Figure 4:
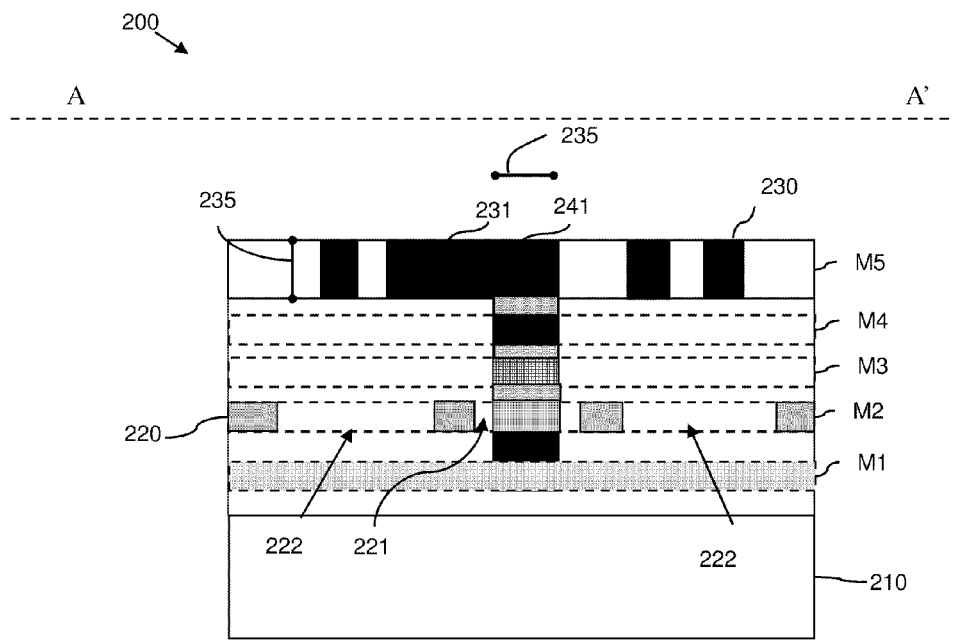
FIG. 4 is a drawing illustrating cross-section view of the integrated circuit structure of FIG. 3.

Referring to the top and cross-section view of FIGS. 3 and 4 in combination, embodiments of the integrated circuit structure 200 can comprise a substrate 210, a first metal level (e.g., M1) above the substrate 210, and a second metal level (e.g., M5) above the first metal level. This integrated circuit structure 200 can further comprise an inductor 230 in the second metal level (i.e., a back end of the line (BEOL) inductor). The inductor 230 can be aligned over and be substantially parallel to the substrate 210. The inductor 230 can comprise a planar conductive coil (e.g., a circular coil, a rectangular coil, an octagonal coil, etc.), having an inner end 231 and an outer end 232.

More specifically, the inductor 230 can comprise a patterned conductive wire 233 that has a first end (e.g., an inner end). The wire 233 can wind (i.e., spiral, turn, etc.) in a rectangular, square, circular, octagonal, etc. coil around the first end 231 such that each turn, spiral, etc. is on the same horizontal plane and such that each successive turn around the inner end 231 has a greater diameter. Thus, the body of the wire 233 can surround the first end 231. The wire 233 can further have a second end 232 (e.g., an outer end). This wire 233 can lie in a first plane (e.g., the second metal level, M5) that is parallel to the substrate 210 and parallel to a second plane (e.g., the first metal level, M1) above the substrate 210.

Additionally, a conductor 241 (e.g., a via stack) can extend vertically from one end 231 (i.e., a first end, e.g., the inner end) of the coil down to the first metal level (e.g., M1) or to the substrate surface such that the conductor 241 is perpendicular to the inductor 230, to the first metal level (e.g., M1) and to the substrate 210.

The integrated circuit structure 200 can further comprise a third metal level (e.g., M2) between the first metal level (e.g., M1) and the second metal level (e.g., M5). This third metal level (i.e., a third plane) can comprise a patterned conductive shield 220 for minimizing any coupling and, specifically, to minimize any inductive coupling between the substrate 210 and the inductor 230 and, thereby, to ensure that the quality factor Q of the inductor 230 is optimized. This shield 220 can comprise any conductive patterned shield suitable for minimizing inductive coupling. Specifically, the pattern of the conductive shield 220 can comprise a conductive structure that lies in the second plane (e.g., the first metal level, M1) that is parallel to the inductor 230. The conductive shield 220 can comprise a radial pattern, a linear pattern, or any other suitable pattern comprising slots 222 (e.g., dielectric filled-sections) between conductive portions of the shield 220, which prevent circular currents from forming and, thereby, prevent inductive coupling. For example, the circuit 200 can incorporate a conductive patterned shield similar to those disclosed in U.S. Pat. No. 6,833,603 of Park et al. issued on Dec. 21, 2004 and incorporated herein by reference.

However, the shield 220 of the present invention can further comprise an opening 221 to accommodate the conductor 241 (e.g., the via stack) that extends downward from the inductor 230 perpendicular to the shield 220. The space within the opening 221 between the via stack 241 and the shield 220 can be filled with an inter level dielectric to ensure that the via stack 241 is isolated from the shield 220. While this opening 221 may reduce the quality factor Q of the inductor 230 to a degree, this reduction in quality is traded off against circuit size scaling gains as well as ESD robustness gains resulting from the fact that the inductor 230 does not require a narrow underpass (e.g., see underpass 142 of FIG. 1) in a metal level (e.g., M3) between the inductor 230 and shield 220 so that an inner end of the inductor 230 may be electrically connected to either the first metal level (e.g., M1) or the substrate surface and, thereby circuits or devices in the substrate.

Figure 5:
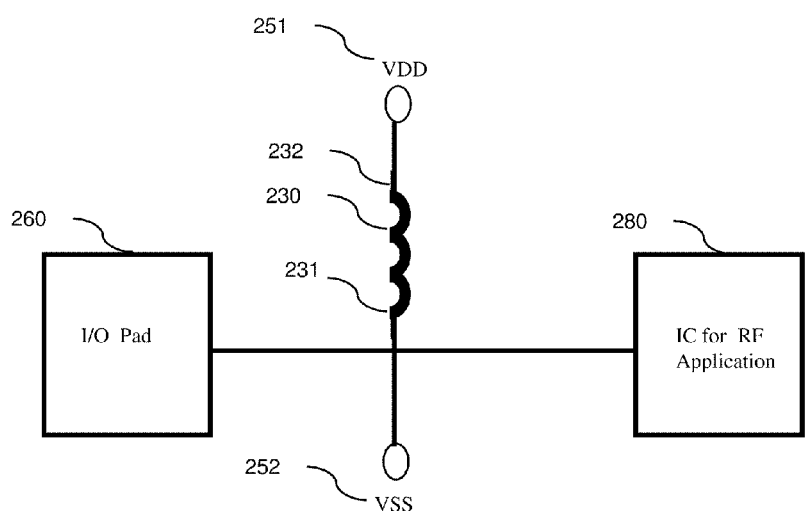
FIG. 5 is schematic diagram illustrating the integrated circuit structure of FIG. 3.

Referring to FIG. 5, the inductor 230 alone can function as an electrostatic discharge (ESD) device for an additional circuit 280 (e.g., a functional integrated circuit for a radio frequency (RF) application) wired to the first metal level (e.g., M1). Specifically, the integrated circuit structure can further comprise an input/output pad 260 and an additional circuit 280. A second end 232 (e.g., the outer end) of the coil 230 can be electrically connected to a positive supply voltage 251 and the first end 231 (e.g., the inner end) of the coil 230 can be electrically connected to the input/pad 260 and to the additional circuit 280 (e.g., via the first metal level). If the first end 231 of the coil 230 is further shorted to ground 252 and the coil 230 comprises a metal wire having a predetermined minimum width that is capable of sustaining a specified current density (e.g., an electrostatic discharge (ESD) current density) without failure, then the inductor 230 can function as an ESD device for protecting the circuit 280. Alternatively, if the second end (e.g., the outer end) of the coil is further connected to $V_{DD}$ and the coil comprises a metal wire having a predetermined minimum width that is capable of sustaining a specified current density (e.g., an electrostatic discharge (ESD) current density) without failure, then the inductor can function as an ESD device.

Alternatively, the inductor 230 can work in combination with another ESD device forming an ESD circuit in order to provide ESD protection to an additional circuit that is wired to the first metal level (e.g., to a functional integrated circuit used in an RF application). Specifically, referring to FIG. 6, in one exemplary embodiment, the integrated circuit structure 600 can comprise an electrostatic discharge (ESD) circuit. This ESD circuit can comprise a semiconductor device connected in parallel with the BEOL inductor 630, and more specifically, an electrostatic discharge (ESD) device 611 connected in parallel with the BEOL inductor 630, for providing ESD protection to the additional circuit. Thus, the ESD circuit comprises a series inductor-capacitor (LC) circuit because semiconductor devices necessarily have capacitance.

The inductor 630 in this parallel LC circuit (i.e., the ESD circuit) can be configured to nullify, for a given application frequency (ω), the capacitance value of that ESD device 611. The embodiment further allows the size of the ESD circuit to be minimized and ESD robustness to be optimized by aligning the inductor above the ESD device 611 and using a single vertical conductor 641 (e.g., a via stack) to form the electrical connection between the inner end 631 of the inductor coil 630 and the ESD device 611. Specifically, by avoiding the use of a horizontal underpass between the inductor 630 and first metal level (e.g., M1), ESD robustness can be improved because the width of the conductor would not be reduced. Additionally, the quality factor Q of the inductor 630 is optimized by providing, between the inductor 630 and ESD device 611, a shield 620 to minimize inductive coupling. An opening in the shield 620 allows the via stack 641 to pass through, trading off a reduction in the quality factor Q of the inductor 630 with the gains in circuit size scaling and ESD robustness.

More particularly, integrated circuit structure 600 can comprise a substrate 610, a first metal level (e.g., M1) above the substrate 610, and a second metal level (e.g., M5) above the first metal level. The integrated circuit structure 600 can further comprise an ESD device 611 in the substrate 610 and wired to (i.e., electrically connected to), for example, the first metal level (e.g., M1). This ESD device 611 can comprise a single component or a multi-component device. The type and size of the ESD device 611 can be predetermined so that the ESD device 611 is capable of providing a desired level of electrostatic discharge (ESD) protection to an additional circuit (e.g., a integrated circuit designed for a radio frequency (RF) application). Specifically, the ESD device 611 can comprise a conventional ESD device, for example, a diode, a double diode, a poly-bound diode, an n-type field effect transistor (n-FET), a p-type field effect transistor (p-FET), a bipolar transistor, a silicon-controlled rectifier, a resistor, a varactor, etc., or any suitable combination thereof. The ESD device can comprise, for example, silicon, silicon germanium, germanium, gallium arsenide, or indium phosphide. Based on the size and type of the ESD device 611, it will necessarily have a specific capacitance value (C).

The integrated circuit structure 600 can further comprise an inductor 630 in the second metal level (e.g., M5) such that is aligned over and substantially parallel to the ESD device 610. This inductor 630 can comprise a planar conductive coil contained within the single metal level (e.g., M5), having an inner end 631 and an outer end 631. The inductor 630 can comprise a planar conductive coil (e.g., a circular coil, a rectangular coil, a square coil, an octagonal coil, etc.), having an inner end 631 and an outer end 632. More specifically, the inductor 630 can comprise a patterned conductive wire 633 that has a first end (e.g., an inner end). The wire 633 can wind (i.e., spiral, turn, etc.) in a circular, square, rectangular, octagonal, etc. coil around the first end 631 such that each turn, spiral, etc. is on the same horizontal plane and such that each successive turn around the inner end 631 has a greater diameter. Thus, the body of the wire 633 can surround the first end 631. The wire 233 can further have a second end 232 (e.g., an outer end). This wire 633 can lie in a first plane (e.g., the second metal level, M5) that is parallel to the substrate 610 and parallel to a second plane (e.g., the first metal level, M1) above the substrate 610.

Additionally, a conductor 641 can extend vertically downward from one end (i.e., a first end, e.g., the inner end 631) of the coil to the first metal level (e.g., M1) or to the substrate surface such that the conductor 641 is perpendicular to the inductor 230 in the second metal level (e.g., M5), to the first metal level (e.g., M1) and to the substrate 610 and such that the inductor 630 is electrically connected to the ESD device 611. This conductor 641 can comprise, for example, a conventionally formed BEOL via stack (i.e., a stacked via pillar). BEOL via stacks are typically formed with wirings of high conductivity metallurgies on different metal levels (e.g., M1-M5) embedded in and insulated from each other by inter level dielectrics (ILD) and interconnected at desired points by metal filled via-studs. Thus, the integrated circuit 600 comprises an ESD circuit comprising a parallel inductor-capacitor (LC) circuit.

The coil 630 can comprise a metal wire (e.g., a copper (Cu) or (Al) wire that is pre-selected for ESD robustness) with a predetermined minimum width 635 (i.e., cross-section) also pre-selected for ESD robustness (i.e., preselected to sustain a specified current density (e.g., a specified electrostatic discharge current density) without failure. Thus, since typically the back end of the line (BEOL) metal levels (Mn-M1) progressively decrease in thickness towards the substrate 610 (i.e., towards the ESD device 611), the inductor coil 630 can be formed in a pre-selected one of the BEOL metal levels (e.g., in M5, as illustrated) in order to accommodate the required minimum wire width 635. As with the inductor 641, the conductor 641 can comprise a predetermined cross-section that is capable of sustaining the specified current density without failure.

Furthermore, the inductor 630 in this LC circuit can be configured to have a predetermined inductance value (L). This predetermined inductance value (L) can be based on the capacitance value (C) of the ESD device 611 and on a specified application frequency ($\omega$) (e.g., the application frequency ($\omega$) of the RF application) so that the overall impedance value ($Z_{LC}$) of the LC circuit is at or near LC resonance (e.g., is approaching infinity). An LC circuit impedance value ($Z_{LC}$) at or near LC resonance (i.e., approaching infinity) ensures that the LC circuit is not seen by the additional circuit being protected by the ESD circuit (e.g., a functional integrated circuit in an RF application). This condition is optimal for circuits in RF applications which require constant impedance. To accomplish this, the inductor 630 should have an inductance value (L) that is approximately equal to one over the product of the capacitance value (C) of the ESD device 611 and the specified application frequency squared ($\omega^2$) (i.e., $L=1/\omega^2 C$). Then, inductor 630 is configured to achieve that predetermine inductance value (L). That is, the shape of the coil 630 (e.g., a circular, square, rectangular, octagonal, etc.), the number of turns (i.e., spirals) in the coil 630, the length of the coil 630 from the inner end 631 to the outer end 632 and the diameter of the coil 630 are all predetermined to achieve the predetermined inductance value (L).

As discussed above, by forming the ESD circuit 600 with both an ESD device 611 and an inductor 630, impedance value of the additional circuit in the RF application remains ($Z_{RF}$) remains constant. A constant impedance value (E.g., of approximately 50 Ohms) is desirable for RF applications. Additionally, by placing the inductor 630 directly over the ESD device 611 and by connecting the inductor 630 and ESD device 611 with a vertical conductor 641, the overall size of the ESD circuit 600 (i.e., the area of a chip taken up by the ESD circuit) can be minimized. By connecting the inductor and ESD device with a vertical via stack and avoiding the use of a horizontal underpass, ESD robustness can be improved. However, because the ESD device 611 is directly below the inductor 630, inductive coupling necessarily occurs and the quality factor Q of the inductor 630 is reduced.

Therefore, the circuit 600 can further comprise a shield 620 in a metal level (e.g., M2) between the inductor 630 and the first metal level (e.g., M1) above the ESD device 611 to minimize inductive coupling and to ensure that the quality factor Q of the inductor 630 is optimized. This shield 620 can comprise a conductive structure that lies in the second plane (e.g., the first metal level, M1) that is parallel to the inductor 630. The conductive shield 620 can further comprise any conductive patterned shield suitable for minimizing inductive coupling. Specifically, the pattern of the conductive shield 620 can comprise a radial pattern, a linear pattern, or any other suitable pattern comprising slots 622 (e.g., dielectric-filled slots) between conductive portions 623 of the shield 620. These slots 622 prevent circular currents from forming and, thereby, prevent inductive coupling. For example, the circuit 600 can incorporate a conductive patterned shield similar to those disclosed in U.S. Pat. No. 6,833,603 of Park et al. issued on Dec. 21, 2004 and incorporated herein by reference.

However, the shield 620 of the embodiment can further comprise an opening 621 to accommodate the conductor 641 (e.g., the via stack) that extends downward form the inductor 630. The space within the opening 621 between the via stack 641 and the shield 620 can be filled with an inter-level dielectric to ensure that the via stack 641 is isolated from the shield 620. While this opening 621 may reduce the quality factor Q of the inductor 630 to a degree, this reduction in quality is traded off against the ESD circuit size-scaling gains as well as ESD robustness gains. These gains result from the fact that the inductor 630 is aligned directly above the ESD device and does not require a narrow underpass in an metal level (e.g., M3) between the shield 620 and inductor 630 (e.g., see underpass 142 of FIG. 1) in order to allow an electrical connection between the inner end 631 of the inductor coil 630 and any other on-chip components outside the lateral boundaries of the shield 620 and inductor 630.

Figure 6:
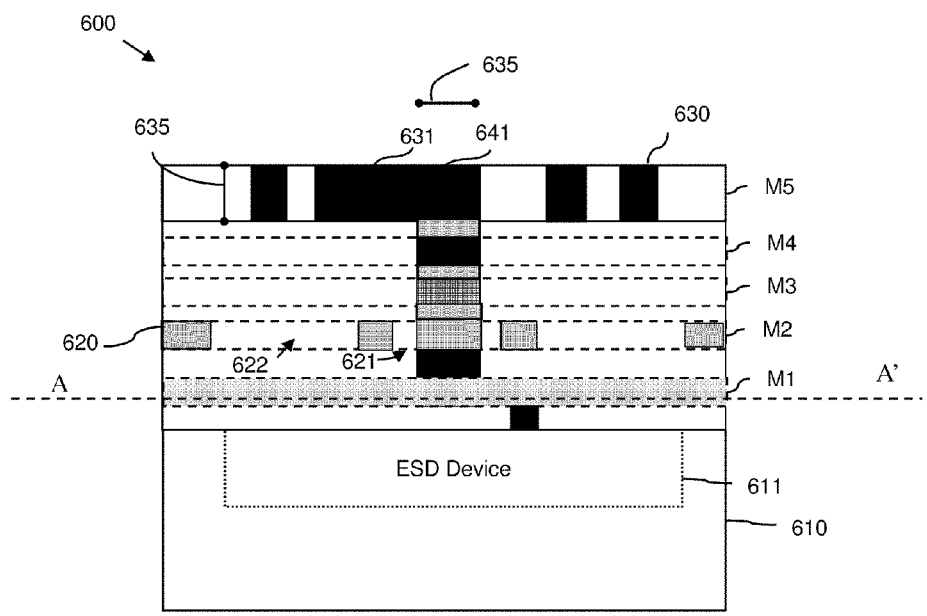
FIG. 6 is a drawing illustrating cross-section view of another embodiment of an integrated circuit structure.
Figure 7:
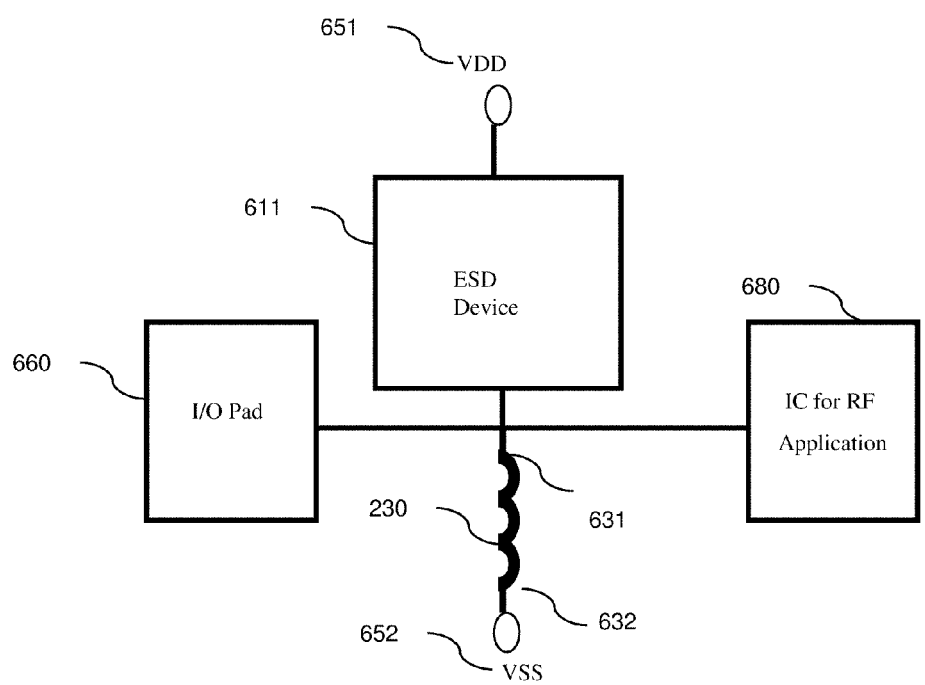
FIG. 7 is schematic diagram incorporating structure of FIG. 6.
Figure 8:
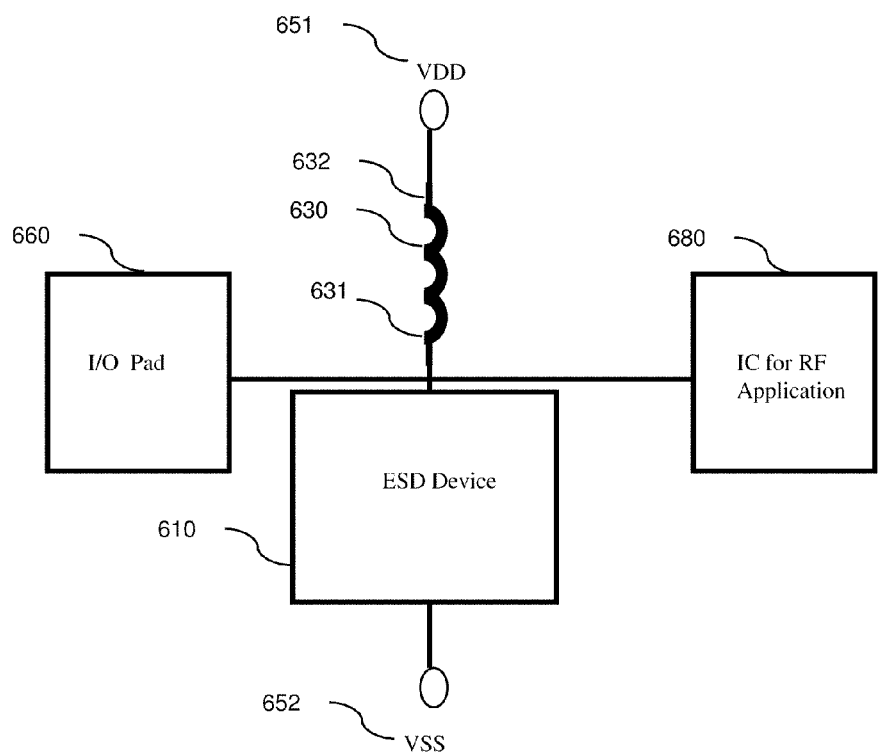
FIG. 8 is an alternative schematic diagram incorporating the structure of FIG. 6.

Referring to the schematic illustrations in FIGS. 7 and 8, in order to complete the ESD circuit 600 and provide ESD protection to an additional integrated circuit 680 (e.g., for an RF application), the integrated circuit structure 600, as described above, can also comprise an input/output pad 260. The one end (i.e., the first end, e.g., the inner end 631) of the inductor coil 630 and the ESD device 611 are electrically connected to each other as well as to the input/pad 660 and to the additional circuit 680. Additionally, as illustrated in FIG. 6, the second end (e.g., the outer end 632) of the coil 260 can be electrically connected to ground 652 (VSS) and the ESD device 611 can be electrically connected to a positive supply voltage 651 (VDD). Alternatively, as illustrated in FIG. 7, the second end (e.g., the outer end 632) of the coil 630 can be electrically connected to a positive supply voltage 651 (VDD) and the ESD device 611 can be electrically connected to ground 652 (VSS).

Figure 9:
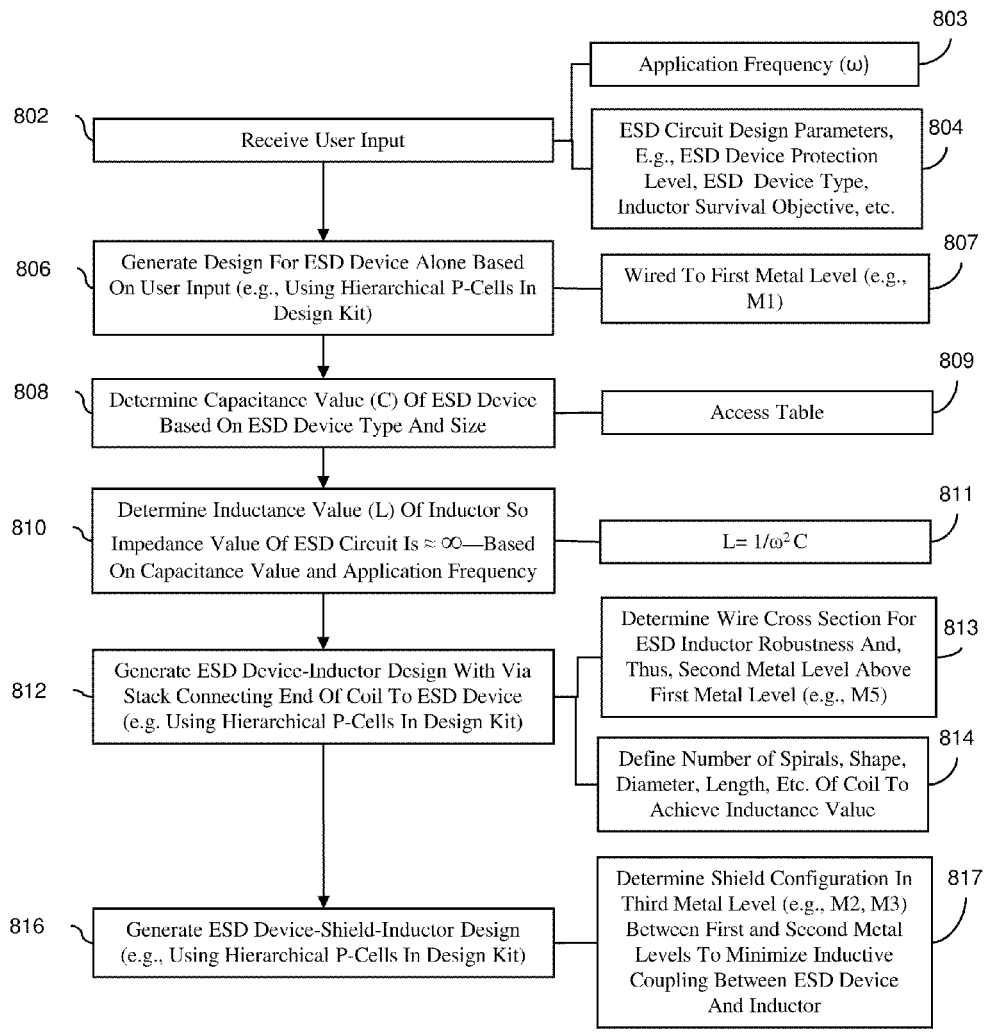
FIG. 9 is a flow diagram illustrating an embodiment of a design methodology.

Referring to FIG. 9, also disclosed are embodiments of a method for designing the integrated circuit structure 600, described above and illustrated in FIG. 6, as well as a program storage device readable by computer and tangibly embodying a program of instructions executable by the computer to perform this method.

Specifically, the method embodiments comprise receiving user input, including design parameters for an electrostatic discharge circuit for protecting an additional circuit of, for example, a radio frequency (RF) application (802-804). The design parameters for the ESD circuit can specify that the ESD circuit will comprise an ESD device 611 in a semiconductor substrate 610 and electrically connected in parallel to a back end of the line (BEOL) inductor 630 so as to form an LC circuit because the ESD device necessarily has capacitance. More specifically, the design parameters can include, but are not limited to, a specific type of ESD device 611 to be used, the desired ESD device protection level and the survival objectives for the inductor (i.e., the current density (e.g., the ESD current density) which the inductor should be able to sustain without failure) (804). Specifically, the ESD device 611 can be specified as a conventional single or multi-component ESD device, for example, a diode, a double diode, a poly-bound diode, an n-type field effect transistor (n-FET), a p-type field effect transistor (p-FET), a bipolar transistor, a silicon-controlled rectifier, a resistor, a varactor, etc., or any suitable combination thereof. Also received is a specified application frequency (i.e., the application frequency for the circuit being protecting by the ESD circuit) (803).

Based on these user-defined design parameters (e.g., based on the specific type of ESD device 611 to be used and the desired ESD device protection level) as well as additional previously established (i.e., programmed) design parameters for the selected ESD device, an initial design for the ESD device 611 alone is generated (i.e., a first design) (806). Generation of the first design can comprise generating both schematic and layout designs which indicate among other things the type and size of the ESD device as well as the wiring for the ESD device (807). For example, the design can indicate that the ESD device 611 is wired to the first metal level (e.g., M1).

Based on this first design, a capacitance value (C) for the ESD device 611 can be determined (808). Specifically, a table of capacitance values according to device sizes and types can be accessed and the capacitance value of the ESD device 611 can thus be determined based on its type and size as specified by the first design (809).

Once the capacitance value (C) of the ESD device 611 is determined, a desired inductance value (L) for the inductor 630 can be determined) so that the overall impedance value ($Z_{LC}$) of the LC circuit is at or near LC resonance (e.g., is approaching infinity) (810). Specifically, if the application frequency is approximately equal to the resonance frequency of the LC circuit, than a LC circuit impedance value ($Z_{LC}$) approaches infinity. An LC circuit impedance value ($Z_{LC}$) at resonance frequency (i.e., approaching infinity) ensures that the LC circuit is insignificant when placed in parallel with the additional circuit being protected by the ESD circuit (i.e., is not seen by the additional circuit being protected by the ESD circuit) so that the impedance value of the additional circuit ($Z_{RF}$) is not decreased as a result of the ESD device. This condition is optimal for functional circuits in RF applications which require constant impedance. To determine the inductance value (L) the method solves for one over the product of the capacitance value (C) of the ESD device and the specified application frequency squared ($\omega^2$) (i.e., $L=1/\omega^2 C$) (811).

Once the desired inductance value (L) is determined, then another design (i.e., a second design) can be generated which comprises an inductor 630 with the inductance value previously determined and which also incorporates the initial design for the ESD device 611 (812). Specifically, the design for the inductor-ESD device combination (i.e., the second design) is generated such that it comprises a planar conductive coil 630 formed in a second metal level (e.g., the M5 level) that is above the first metal level (e.g., above M1) and, more specifically, that is above the ESD device 611. Achieving the desired inductance value is accomplished by selecting the diameter of the planar conductive coil, the shape (e.g., square, rectangular, circular, octagonal, etc.) of the coil, the number of turns (i.e., spirals) in the coil and the length of the coil from the inner end 631 to the outer end 632 (814).

Specifically, the inductor 630 can be designed as a wire 633 that winds (i.e., spiral, turn, etc.) in a circular, square, rectangular, octagonal, etc. coil around the first end 631 such that each turn, spiral, etc. is on the same horizontal plane and such that each successive turn around the inner end 631 has a greater diameter. Thus, the body of the wire 633 can surround the first end 631. The wire 233 can further have a second end 232 (e.g., an outer end). This wire 633 can lie in a first plane (e.g., the second metal level, M5) that is parallel to the substrate 610 and parallel to a second plane (e.g., the first metal level, M1) above the substrate 610.

This second design should orient (i.e., align) the inductor 630 over the ESD device 611 and should electrically connect the inductor 630 to either the first metal level (e.g., M1) or the substrate such that the inductor 630 and ESD device 611 are electrically connected. This is accomplished by providing a conductor 641 that extends vertically from one end (i.e., a first end, e.g., the inner end 631) of the inductor coil 630 to the ESD device metallization (i.e., the first metal level (e.g., M1)) or to the substrate surface such that the conductor 641 is perpendicular to the inductor 230 in the second metal level (e.g., M5), to the first metal level (e.g., M1) and to the substrate 610 and such that the ESD device 611 and inductor 630 are electrically connected. This conductor 641 can be designed, for example, as a conventional BEOL via stack (i.e., a stacked via pillar, see discussion above). By using a single vertical via stack and avoiding the use of a horizontal underpass, ESD robustness can be improved because the conductor width does not have to be reduced.

Additionally, as mentioned above, the design parameters received as input from a user at step 802 can comprise a specified current density (e.g., an ESD current density), which the ESD circuit and, particularly, the inductor 630 should be able to sustain without failure. Based on this current density, the method can further comprise determining the minimum wire width required for the inductor 630 to be able to sustain this current density (813) and, then generating the second design at process 812 so that the inductor coil 630 as well as the via stack 641 have no less than this minimum wire width. In order to ensure that this minimum wire width 635 is met by the inductor 630, the method comprises selecting the metal level (e.g., M5) with the desired thickness for forming the coil. As with the first design, generation of the second design can comprise generating both schematic and layout designs.

By designing the ESD circuit with both an ESD device 611 and an inductor 630 in series, impedance ($Z_{RF}$) of the additional circuit being protected by the ESD circuit remains uniform (i.e., constant), which is optimal for RF applications. By designing the ESD circuit such that the inductor 630 is positioned directly over the ESD device 611 and such that the electrical connection is provided by a vertical via stack 641, the size of the ESD circuit can be minimized. However, because the ESD device 611 is positioned directly below the inductor 630, inductive coupling will occur and the quality factor Q of the inductor 630 will be reduced. Therefore, the method embodiments further comprise generating a third design comprising a patterned conductive shield 620 (816).

Generating the design for the inductor-shield-ESD device combination (i.e., the third design) can comprise designing a shield 620 that is to be positioned parallel to and between the inductor 230 and ESD device 210 and that is configured to minimize capacitance coupling (817). The design for the shield 620 can comprise a conductive structure that lies in the second plane (e.g., the first metal level, M1) that is parallel to the inductor 630. Additionally, the design for the shield 620 can comprise any conductive planar patterned shield suitable for minimizing inductive coupling. Specifically, the pattern of the conductive shield 620 can comprise a radial pattern, a linear pattern, or any other suitable pattern comprising slots 622 (e.g., dielectric-filled slots) between conductive portions 623 of the shield 620. These slots 622 prevent circular currents from forming and, thereby, prevent inductive coupling. For example, the circuit 600 can incorporate a conductive patterned shield similar to those disclosed in U.S. Pat. No. 6,833,603 of Park et al. issued on Dec. 21, 2004 and incorporated herein by reference.

However, the shield 620 can further be designed to include an opening 621 to accommodate the conductor 641 (e.g., the via stack) that extends downward from the inductor 630. The design can further include an inter-level dielectric (ILD) material to fill the space in the opening 621 surrounding the via pillar 641. While this opening 621 may reduce the quality factor Q of the inductor 630 to a degree, this reduction in quality is traded off against the ESD circuit size-scaling gains as well as ESD circuit robustness gains, which result from the fact that the inductor 630 does not require a narrow underpass (see underpass 142 of FIG. 1) to bypass the shield 620 and complete the electrical connection between the inductor 630 and ESD device 611.

The method embodiments, as described above, can be computer-implemented in a manner similar to the method embodiments disclosed in the following documents which are incorporated herein by reference: (1) U.S. Pat. No. 6,704, 179 of Voldman, issued on Mar. 9, 2004 and (2) U.S. Patent Application Pub. No. 2005/0102644 of Collins et al., published on May 12, 2005. Specifically, the method of designing the ESD circuit 600, as described above, can be implemented at each of the design stages (i.e., the first design stage for the ESD device alone (see step 802), the second design stage that incorporates an inductor into the first design (see step 812), and the third design stage that incorporates a shield into the second design (see step 816)), using a design kit comprising hierarchical parameterized cells (p-cells), which are constructed into higher level networks to ultimately form layout and schematic designs for the completed ESD circuit 600.

More specifically, the design kit comprises hierarchical parameterized cells or p-cells for electronic components of ESD devices, inductors and shields. The p-cells within the kit can comprise simple lower level p-cells comprising the lowest level of components and higher level p-cells comprising, for example, strings of components. These p-cells are essentially computer models of the components comprising all of the parameters necessary for the computer to simulate the components in order to generate both layout and schematic designs. Some of the p-cell parameters are fixed (e.g., by the type of component), while others are user-specified or auto-generated based on user-inputs. Additionally, some of the p-cells can be manipulated (i.e., are grow-able using stretch lines to adjust size, shape, etc.) in order to achieve certain parameters. The p-cells, as selected and manipulated, can be connected with parameterized interconnects to ultimately generate the ESD circuit 200 layout and schematic.

Figure 10:
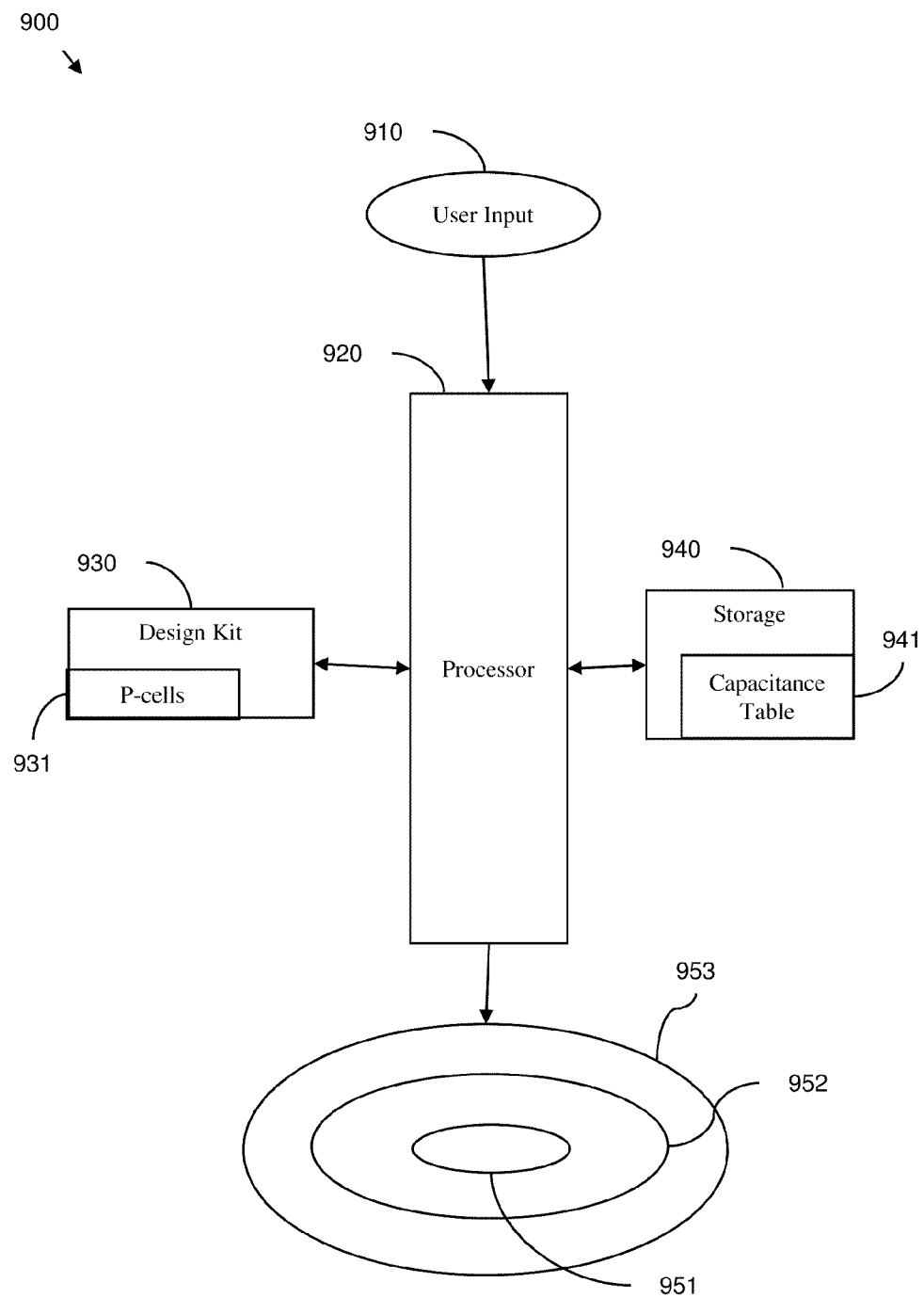
FIG. 10 is as schematic diagram illustrating an embodiment of a design system.

Finally, referring to FIG. 10, also disclosed are embodiments of an associated design system 900 for designing the electrostatic discharge circuit 200, described above and illustrated in FIGS. 3 and 5. Specifically, the design system 900 embodiments comprise a user interface 910, at least one processor 920, a design kit 930 and a storage device 940.

The user interface 910 (e.g., a graphical user interface (GUI)) can be adapted to receive design parameters for an electrostatic discharge (ESD) circuit for protecting an additional circuit (e.g., a circuit of a radio frequency (RF) application). The design parameters for the ESD circuit can specify that the ESD circuit will comprise an ESD device 611 in a substrate 610 and electrically connected in parallel to a BEOL inductor 630 so as to form an LC circuit. More specifically, the design parameters can include, but are not limited to, a specific type of ESD device to be used, the desired ESD device protection level and the survival objectives for the inductor (i.e., the current density (e.g., the ESD current density) which the inductor should be able to sustain without failure). The ESD device 611 can be specified as a conventional single or multi-component ESD device, for example, a diode, a double diode, a poly-bound diode, an n-type field effect transistor (n-FET), a p-type field effect transistor (p-FET), a bipolar transistor, a silicon-controlled rectifier, a resistor, a varactor, etc., or any suitable combination thereof. Also received is a specified application frequency (i.e., the application frequency for the circuit being protecting by the ESD circuit).

The processor 920 can be adapted to (e.g., programmed) to generate an initial design (i.e., a first design 951) for the ESD device 611 alone based on the design parameters (e.g., based on the specific type of ESD device to be used and the desired ESD device protection level) received via the user interface 910. Specifically, the ESD device 611 can be designed as conventional single or multi-component ESD device 611, for example, a diode, a varactor, a poly-bound diode, an n-type field effect transistor (n-FET), a p-type field effect transistor (p-FET), a bipolar transistor, a silicon-controlled rectifier, a resistor, etc. or any suitable combination thereof (e.g., the double diode ESD device, as illustrated in FIG. 4). The first design 951 that is generated by the processor 920 can comprise both schematic and layout designs and can indicate the type and size of the ESD device 210.

The processor 920 can be further adapted to determine, based on this first design 951, a capacitance value for the ESD device 611. Specifically, the design system 900 can further comprise a storage device 940 comprising a table 941 of capacitance values according to device sizes and types. The processor 920 can be adapted to access the table 941 in order to determine the capacitance value of the ESD device 611 based on its particular size and type as specified in the initial design 951.

The processor 920 can be further adapted to determine, based on this capacitance value and on the application frequency specified by the user, a desired inductance value for the inductor 630. The desired inductance value for the inductor 630 can be determined so that the LC circuit (i.e., the ESD circuit) will have an impedance value near its resonant frequency. Specifically, an LC circuit impedance value ($Z_{LC}$) near the resonant frequency (e.g., of approximately infinity) ensures that the LC circuit is not seen by the additional circuit being protected by the ESD circuit so that the impedance value of the additional circuit ($Z_{RF}$) is not decreased as a result of the ESD device. This condition is optimal for circuits in RF applications which require constant impedance. To determine the inductance value (L) for the inductor 630, processor 920 is adapted to solve for one over the product of the capacitance value (C) of the ESD device 611 and the specified application frequency squared ($\omega^2$) (i.e., $L=1/\omega^2 C$).

The processor 920 can be further adapted to generate another design (i.e., a second design 952) which comprises an inductor 630 with the inductance value previously determined and which also incorporates the initial design 951 for the ESD device 611 alone.

Specifically, the processor 920 can generate the design for the inductor-ESD device combination (i.e., the second design) by designing a planar conductive coil 630 that will be formed in a second metal level (e.g., M5) above the first metal level (e.g., M1) to which the ESD device 611 is wired. The processor 920 can generate this design by selecting the diameter of a planar conductive coil 630, the shape (e.g., rectangular, square, circular, octagonal, etc.) of the coil 630, the number of turns (i.e., spirals) in the coil 630 and the length of the coil 630 from the inner end 631 to the outer end 632 so that the resulting inductor 630 will achieve the desired inductance value. Specifically, the inductor 630 can be designed by the processor 920 as a wire 633 that winds (i.e., spiral, turn, etc.) in a circular, square, rectangular, octagonal, etc. coil around the first end 631 such that each turn, spiral, etc. is on the same horizontal plane and such that each successive turn around the inner end 631 has a greater diameter. Thus, the body of the wire 633 can surround the first end 631. The wire 233 can further have a second end 232 (e.g., an outer end). This wire 633 can lie in a first plane (e.g., the second metal level, M5) that is parallel to the substrate 610 and parallel to a second plane (e.g., the first metal level, M1) above the substrate 610.

The processor 920 can be further adapted to generate this second design such that the inductor 930 is oriented (i.e., aligned) over the ESD device 611 and electrically connected to the first metal level (e.g., M1 to which the ESD device 611 is wired) by a conductor 641 (e.g., a via stack, as discussed above) that extends vertically from one end (i.e., a first end, e.g., an inner end 631) of the inductor coil 630 to the ESD metallization (i.e., the first metal level (e.g., M1)) or to the substrate surface such that the conductor 641 is perpendicular to the inductor 630 in the second metal level, to the first metal level and to the substrate and such that the ESD device 611 and inductor 630 are electrically connected.

Additionally, as mentioned above, the design parameters received as input 910 from a user can comprise a specified current density (e.g., an ESD current density), which the ESD circuit and, particularly, the inductor 630 should be able to sustain without failure. The processor 920 can be adapted to determine the minimum wire width 635 required for the inductor 630 to be able to sustain this current density and can further generate the second design 952 so that the inductor coil 630 and the via stack 641 have no less than this minimum wire width 635. Thus, the processor 920 must assign the inductor 630 to a particular metal level (e.g., M5) in the layout in order to ensure that the minimum wire width 635 can be achieved. As with the first design 951, this second design 952 can be generated so that it comprises both schematic and layout designs.

In order to minimize inductive coupling between the inductor 630 and the ESD device 611 of the second design 952 and, thereby, to optimize the quality factor (Q), the processor 920 can also be adapted to generate a third design 953 that comprises a shield and that incorporates the second design 952. Specifically, the processor 920 can be adapted to generate a design 953 for an inductor-shield-ESD device combination (i.e., a third design), wherein the shield is parallel to the inductor 630 and the substrate. The design for the shield 620 can comprise any planar conductive patterned shield suitable for minimizing inductive coupling. Specifically, the pattern of the conductive shield 620 can comprise a radial pattern, a linear pattern, or any other suitable pattern comprising slots 622 (e.g., dielectric-filled slots) between conductive portions 623 of the shield 620. As discussed above, these slots 622 prevent circular currents from forming and, thereby, prevent inductive coupling.

The design system 900 can further comprise a design kit 930. This design kit 930 can be similar to that described in U.S. Pat. No. 6,704,179 and U.S. Patent Application Pub. No. 2005/0102644 referenced above. Specifically, this design kit 930 can comprise hierarchical parameterized cells (p-cells) 931 for electronic components of electrostatic discharge devices, inductors and shields, each of which can be constructed in a computer-aided design (CAD) environment. The processor 900 can be adapted to access the kit 930 and to use these hierarchical parameterized cells in generating each of the above-described designs (i.e., the first design 951 for the ESD device 611 alone, the second design 952 that incorporates an inductor 630 into the first design 951 and the third design 953 that incorporates a shield 620 into the second design 951) at each of the design stages (see steps 806, 812 and 816 of FIG. 9).

More specifically, the p-cells 931 within the design kit 930 can comprise simple lower level p-cells comprising the lowest level of components for the different features of the ESD circuit (i.e., of ESD devices, inductors and shields) and higher level p-cells comprising, for example, strings of these components. These p-cells 931 are essentially computer models of the one or more components with all of the parameters necessary for the computer to simulate the component(s) in order to generate both layout and schematic designs at each of the design stages. Some of the p-cell parameters are fixed (e.g., by the type of component), while others are user-specified or auto-generated based on user-inputs. Additionally, some of the p-cells can be manipulated (i.e., are grow-able using stretch lines to adjust size, shape, etc.) in order to achieve certain parameters. The p-cells, as automatically selected and manipulated, can be connected with parameterized interconnects to ultimately generate the ESD circuit layout and schematic.

The method and system embodiments of the invention can each take the form of an entirely hardware embodiment, an entirely software embodiment or an embodiment including both hardware and software elements. One exemplary embodiment is implemented in software, which includes but is not limited to firmware, resident software, microcode, etc.

Furthermore, these embodiments can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor connected directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be connected to the system either directly or through intervening I/O controllers. Network adapters may also be connected to the system to enable the data processing system to become connected to other data processing systems or remote printers or storage devices through intervening private or public networks. Modems, cable modem and Ethernet cards are just a few of the currently available types of network adapters.

Figure 11:
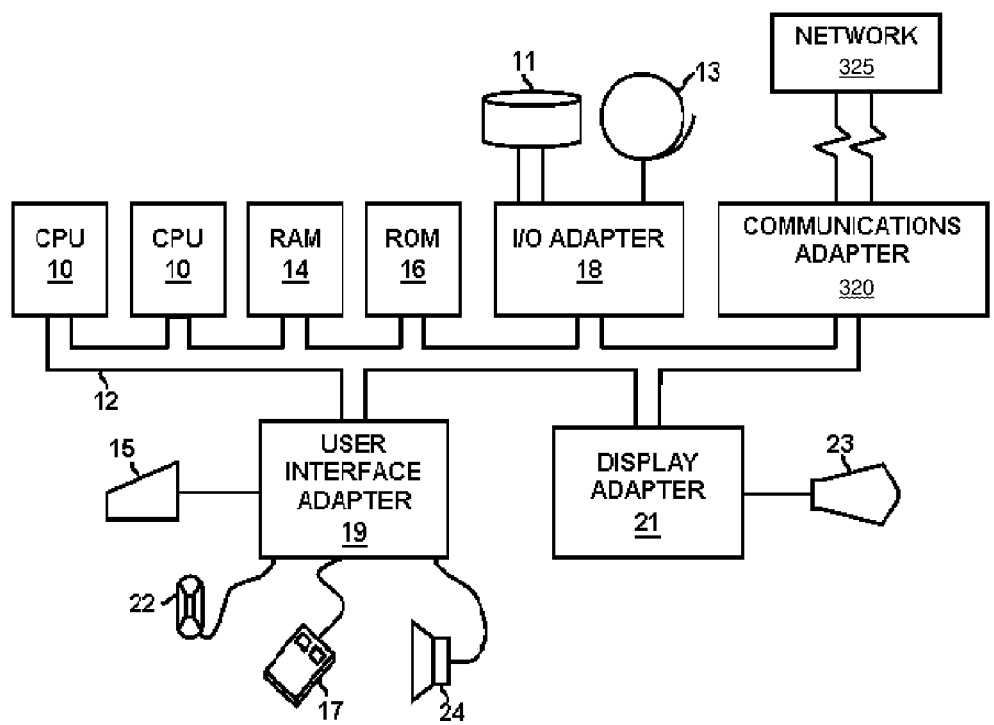
FIG. 11 is a schematic representation of a computer system suitable for use in implementing the design methodology and system as described herein.

A representative hardware environment for practicing the embodiments of the invention is depicted in FIG. 11. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

Therefore, disclosed above are embodiments of an improved integrated circuit structure and, particularly, an improved electrostatic discharge (ESD) circuit structure, which incorporates an inductor. Also, disclosed are a design methodology and a design system. The ESD circuit structure can comprise an ESD device in a semiconductor substrate and wired to a metal level (e.g., M1, M2, M3, etc.) above the substrate. An inductor in a higher metal level (e.g., M5) can be aligned over and electrically connected in parallel to the ESD device by a via stack that extends vertically from, for example, an inner end of the inductor coil down to the given metal level (e.g. or to the silicon substrate). This configuration forms an inductor-capacitor (LC) ESD circuit and allows for ESD circuit size-scaling. Additionally, the inductor in the LC circuit is configured to nullify, for a given application frequency, the capacitance value of that ESD device. The quality factor Q of the inductor is optimized by providing, between the inductor and the ESD element, a shield to minimize inductive coupling. An opening in the shield allows the via stack to pass through, trading off any reduction in the Q factor with gains in size-scaling and ESD robustness.

It is understood that in this methodology, the definition of the inductor, and any ESD element can be further expanded for co-synthesis with the RF circuit, or part of the RF circuit or in parallel with the RF circuit. In addition, the methodology can be applied to more complex ESD networks wherein the ESD inductor-ESD device LC parallel combination can be integrated with other ESD elements (e.g. diode and ESD inductor/ESD element series configuration) in series configurations.

It is understood that in this methodology, the definition of the inductor, and any ESD element can be further expanded for co-synthesis with the RF circuit, or part of the RF circuit or in parallel with the RF circuit. In addition, the methodology can be applied to more complex ESD networks wherein the ESD inductor-ESD device LC parallel combination can be integrated with other ESD elements (e.g. diode and ESD inductor/ESD element series configuration) in both parallel configurations.

It is understood that in this methodology, the definition of the inductor, and any ESD element can be further expanded for co-synthesis with the RF circuit, or part of the RF circuit or in parallel with the RF circuit and not electrically connected to the VDD or VSS power rails. This methodology can be applied to both internal and external circuits where ESD robustness is desired within a peripheral circuit, or internal circuit. In addition, this can be applied between power supplies (e.g. VDD to VSS), or between common ground (VSS to AVSS).

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention can be practiced with modification within the spirit and scope of the appended claims.

What is claimed is:

1. A computer-implemented method for designing an integrated circuit structure, said method comprising:
   receiving, by a computer, design parameters for an electrostatic discharge circuit and a specified application frequency, wherein said electrostatic discharge circuit comprises an electrostatic discharge device electrically connected in parallel to an inductor;
   generating, by said computer, a first design for said electrostatic discharge device based on said design parameters;
   determining, by said computer and based on said first design, a capacitance value for said electrostatic discharge device;
   determining, by said computer and based on said capacitance value and said application frequency, an inductance value for said inductor to ensure that a subsequently designed inductor-capacitor (LC) circuit will have a resonant frequency at said application frequency; and
   generating, by said computer, a second design comprising said inductor with said inductance value aligned over and electrically connected to said electrostatic discharge device of said first design to form said inductor-capacitor circuit.

2. The method of claim 1, wherein said determining of said capacitance value comprises:
   accessing a table of capacitance values according to device sizes and types; and
   determining said capacitance value based on a type and size of said electrostatic discharge device as specified by said first design.

3. The method of claim 1, wherein said determining of said inductance value comprises solving for one over a product of a capacitance value of said electrostatic discharge device and said specified application frequency squared.

4. The method of claim 1, wherein said generating of said second design comprises selecting a diameter of a planar conductive coil for said inductor, a shape of said coil, a number of turns in said coil and a length of said coil sufficient to achieve said inductance value.

5. The method of claim 1,
   wherein said receiving of said design parameters comprises receiving a specified current density, and
   wherein said method further comprises:
      determining, by said computer, a minimum wire width for said inductor that is sufficient to sustain said specified current density without failure; and
      generating, by said computer, said second design so that said inductor has no less than said minimum wire width.

6. The method of claim 1,
   wherein said generating of said first design comprises generating said first design such that said electrostatic discharge device is wired to a first metal level above said electrostatic discharge device,
   wherein said generating of said second design comprises generating said second design such that said inductor comprises a planar conductive coil in a second metal level above and parallel to said first metal level and such that a first end of said coil is electrically connected to said first metal level by a conductor extending vertically from said first end to said first metal level such that said conductor is perpendicular to said inductor.

7. The method of claim 6, further comprising generating, by said computer, a third design comprising a shield in a third metal level between and parallel to said first metal level and said second metal level,
wherein said shield is configured to minimize inductive coupling between said inductor and said electrostatic discharge device of said second design and comprises an opening through which said conductor extends perpendicular to said shield.

8. The method of claim 1, wherein said generating of said first design, said generating of said second design and said generating of said third design comprise using a design kit comprising hierarchical parameterized cells for electronic components of electrostatic discharge devices, inductors, and shields.

9. A program storage device readable by computer and tangibly embodying a program of instructions executable by said computer to perform a method of designing an integrated circuit structure, said method comprising:
receiving design parameters for an electrostatic discharge circuit and a specified application frequency, wherein said electrostatic discharge circuit comprises an electrostatic discharge device electrically connected in parallel to an inductor;
generating a first design for said electrostatic discharge device based on said design parameters;
determining, based on said first design, a capacitance value for said electrostatic discharge device;
determining, based on said capacitance value and said application frequency, an inductance value for said inductor to ensure that a subsequently designed inductor-capacitor (LC) circuit will have a resonant frequency at said application frequency; and
generating a second design comprising said inductor with said inductance value aligned over and electrically connected to said electrostatic discharge device of said first design to form said inductor-capacitor circuit.

10. The program storage device of claim 9, wherein said determining of said capacitance value comprises:
accessing a table of capacitance values according to device sizes and types; and
determining said capacitance value based on a type and size of said electrostatic discharge device as specified by said first design.

11. The program storage device of claim 9, wherein said generating of said second design comprises selecting a diameter of a planar conductive coil for said inductor, a shape of said coil, a number of turns in said coil and a length of said coil sufficient to achieve said inductance value.

12. The program storage device of claim 9,
wherein said receiving of said design parameters comprises receiving a specified current density, and
wherein said method further comprises:
determining a minimum wire width for said inductor that is sufficient to sustain said specified current density without failure; and
generating said second design so that said inductor has no less than said minimum wire width.

13. The program storage device of claim 9,
wherein said generating of said first design comprises generating said first design such that said electrostatic discharge device is wired to a first metal level above said electrostatic discharge device, and
wherein said generating of said second design comprises generating said second design such that said inductor comprises a planar conductive coil in a second metal level above and parallel to said first metal level and such that a first end of said coil is electrically connected to said first metal level by a conductor extending vertically from said first end to said first metal level perpendicular to said inductor.

14. The program storage device of claim 13,
wherein said method further comprises generating a third design comprising a shield in a third metal level between and parallel to said first metal level and said second metal level, and
wherein said shield is configured to minimize inductive coupling between said inductor and said electrostatic discharge device of said second design and comprises an opening through which said conductor extends perpendicular to said shield.

15. A computer-aided design system for designing an integrated circuit, said system comprising:
a user interface for receiving design parameters for an electrostatic discharge circuit and a specified application frequency, wherein said electrostatic discharge circuit comprises an electrostatic discharge device electrically connected in parallel to an inductor; and
at least one processor adapted to generate a first design for said electrostatic discharge device based on said design parameters,
wherein said processor is further adapted:
to determine, based on said first design, a capacitance value for said electrostatic discharge device;
to determine, based on said capacitance value and said application frequency, an inductance value for said inductor to ensure that a subsequently designed inductor-capacitor (LC) circuit will have a resonant frequency at said application frequency; and
to generate a second design comprising said inductor with said inductance value aligned over and electrically connected to said electrostatic discharge device of said first design to form said inductor-capacitor circuit.

16. The design system of claim 15, further comprising a storage device comprising a table of capacitance values according to device sizes and types,
wherein said first design comprises a type and size for said electrostatic discharge device, and
wherein said processor is further adapted to access said table in order to determine said capacitance value of said electrostatic discharge device based on said type and said size of said electrostatic discharge device.

17. The design system of claim 15, wherein said processor is further adapted to determine said inductance value by solving for one over a product of a capacitance value of said electrostatic discharge device and said specified application frequency squared.

18. The design system of claim 15, wherein said processor is further adapted to generate said second design such that said inductor comprises a planar conductive coil with a shape, a diameter, a number of turns and a length sufficient to achieve said inductance value.

19. The design system of claim 15,
wherein said design parameters comprise a specified current density, and
wherein said processor is further adapted to determine a minimum wire width for said inductor that is sufficient to sustain said specified current density without failure and further to generate said second design so that said inductor has no less than said minimum wire width.

20. The design system of claim 15, wherein said processor is further adapted:
to generate said first design such that said electrostatic discharge device is wired to a first metal level above said electrostatic discharge device, and
to generate said second design such that said inductor comprises a planar conductive coil in a second metal level above and parallel to said first metal level and such that a first end of said coil is electrically connected to said first metal level by a conductor extending vertically from said first end to said first metal level perpendicular to said inductor.

* * * * *